(12) United States Patent
Pawlak et al.

(10) Patent No.: US 9,368,578 B2
(45) Date of Patent: Jun. 14, 2016

(54) METHODS OF FORMING SUBSTRATES COMPRISED OF DIFFERENT SEMICONDUCTOR MATERIALS AND THE RESULTING DEVICE

(71) Applicant: GLOBALFOUNDRIES Inc., Grand Cayman, KY (US)

(72) Inventors: Bartlomiej Jan Pawlak, Leuven (BE); Steven Bentley, Watervliet, NY (US); Ajey Jacob, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 20 days.

(21) Appl. No.: 13/758,225

(22) Filed: Feb. 4, 2013

(65) Prior Publication Data

US 2014/0217467 A1   Aug. 7, 2014

(51) Int. Cl.
*H01L 29/66* (2006.01)
*H01L 29/12* (2006.01)
*H01L 21/8238* (2006.01)
*H01L 21/84* (2006.01)
*H01L 27/092* (2006.01)
*H01L 27/12* (2006.01)

(52) U.S. Cl.
CPC .......... *H01L 29/12* (2013.01); *H01L 21/823821* (2013.01); *H01L 21/845* (2013.01); *H01L 27/0924* (2013.01); *H01L 27/1207* (2013.01); *H01L 27/1211* (2013.01)

(58) Field of Classification Search
CPC ............ H01L 21/0251; H01L 21/02516; H01L 21/84; H01L 21/0254; H01L 29/7371; H01L 29/2003; H01L 29/267; H01L 29/66242; H01L 21/02658
USPC ........... 257/183, 368; 438/191, 192, 190, 478
See application file for complete search history.

(56) References Cited

U.S. PATENT DOCUMENTS

| | | | |
|---|---|---|---|
| 2004/0178406 A1* | 9/2004 | Chu ................. H01L 21/02381 257/19 |
| 2005/0093104 A1* | 5/2005 | Ieong et al. .................... 257/627 |
| 2006/0113605 A1* | 6/2006 | Currie ........................... 257/368 |
| 2007/0241403 A1* | 10/2007 | Thean et al. ................... 257/351 |
| 2009/0227091 A1* | 9/2009 | Sonsky et al. ................. 438/478 |
| 2009/0236663 A1* | 9/2009 | Teo et al. ....................... 257/347 |
| 2010/0035390 A1* | 2/2010 | Ding ............... H01L 21/823462 438/152 |
| 2013/0052798 A1* | 2/2013 | Bedell et al. ................... 438/458 |
| 2013/0161751 A1* | 6/2013 | Chung et al. .................. 257/368 |
| 2013/0285146 A1* | 10/2013 | Tung ............................. 257/368 |

* cited by examiner

*Primary Examiner* — Matthew Landau
*Assistant Examiner* — Eric Ashbahian
(74) *Attorney, Agent, or Firm* — Amerson Law Firm, PLLC

(57) ABSTRACT

Obtaining a structure comprised of first and second layers of a first semiconductor materials and a strain relief buffer (SRB) layer between the first and second layers, forming a sidewall spacer on the sidewalls of an opening in the second layer, and forming a third semiconductor material in the opening, wherein the first, second and third semiconductor materials are different. A device includes first and second layers of first and second semiconductor materials and an SRB layer positioned above the first layer. The second layer is positioned above a first portion of the SRB layer, a region of a third semiconductor material is in an opening in the second layer and above a second portion of the SRB layer, and an insulating material is positioned between the region comprised of the third semiconductor material and the second layer.

19 Claims, 7 Drawing Sheets

METHODS OF FORMING SUBSTRATES COMPRISED OF DIFFERENT SEMICONDUCTOR MATERIALS AND THE RESULTING DEVICE

BACKGROUND OF THE INVENTION

1. Field of the Invention

Generally, the present disclosure relates to the manufacture of sophisticated semiconductor devices, and, more specifically, to various methods of forming substrates comprised of different semiconductor materials that may be used to manufacture various types of semiconductor devices and integrated circuits.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices which are intended to enhance the performance capabilities of such devices, e.g., to enable low-voltage operation. However, the integration of such alternative materials on silicon substrates (the predominate substrates used in the industry) is a non-trivial matter due to, among other issues, the large difference in lattice constants between such alternative channel materials and silicon.

FIGS. 1A-1C depict illustrative examples of prior art substrates comprised of alternative channel semiconductor materials. One technique of forming such substrates, reflected in FIG. 1A, involves performing a blanket growth process to form a layer of the alternative channel material 14 above a silicon substrate 10. Due to the lattice constant mismatch between the silicon substrate 10 and the alternative channel material 14, this approach typically involves the formation of one or more strain relief buffer (SRB) layers 12 between the substrate 10 and the alternative channel material 14. The drawing on the left in FIG. 1A depicts the situation where a single SRB layer 12 may be formed above the substrate 10. Typically, such a single SRB layer would be relatively thick and the lattice constant of the SRB layer 12 would be different at the SRB/substrate interface and the SRB/channel material interface. The drawing on the right side of FIG. 1A depicts the situation where any number of multiple SRB layers may be positioned between the substrate 10 and the channel material 14. In the depicted example, there are two such illustrative SRB layers 12A, 12B. In a particular situation, the number of SRB sub-layers with each different lattice constant may be quite as high as 20 or 30. Here, for simplicity, we illustrate 2 layers. The SRB layers 12, 12A/B are typically comprised of a set of various materials that are epitaxially grown on top of each other so as to gradually change the lattice constant from the substrate material 10 more towards the lattice constant of the channel material 14, such that the top layer matches the lattice constant of the channel material 14 and is more relaxed and substantially defect-free. The purpose of the SRB layers 12, 12A/B is to provide a smoother, more gradual transition between the two mismatched materials 10, 14, with the ultimate goal being to produce relaxed and defect-free channel material with high charge carrier mobility properties. The structure depicted in FIG. 1A may be formed by epitaxially depositing the various material layers on and above the substrate 10.

In an alternative process, blanket III-V layers may also be formed on or above a silicon substrate by the use of well-known wafer bonding techniques. Using such techniques, one or more III-V layers are transferred from a donor substrate to a target substrate; similar to well-known SOI fabrication processes. FIG. 1B depicts an illustrative example of such a completed substrate wherein the channel material 14 is positioned on a layer of silicon dioxide 13 that was formed on the substrate 10. Using either technique, the substrate 10 remains covered by a layer of the alternative channel material 14. Thus, using this approach, it is difficult to incorporate multiple alternative channel materials on a single substrate that is suitable for use in CMOS applications wherein different type devices, i.e., N-type devices and P-type devices, are formed above a single substrate.

FIG. 1C reflects another technique of forming alternative channel materials that involves a confined growth type processing technique, generally known as aspect ratio trapping (ART). Under the ART approach, a trench 16, typically a high aspect ratio trench having an aspect ratio on the order of about 3:1-8:1, is formed in a dielectric layer 15 formed above a silicon substrate 10. Thereafter, the alternative channel material 14 is grown in the trench 16. Typically, the bottom of the trench 16 exposes the substrate material so as to allow for bottom-up epitaxial growth of the channel material 14. The sidewalls of the trench 16 are typically formed in the dielectric layer 15, e.g., silicon dioxide, so as to provide selectivity of epi growth from the bottom only and not from the sidewalls of the trench 16. The dielectric layer 15 may also serve electrical isolation purposes between devices. Due to the aspect ratio of the trench 16, and the nature in which defects within the alternative channel material 14 propagate upwards (at an angle of about 45°), most defects that originate from the bottom of the trench 16 will naturally stop at the sidewalls of the trench 16, at the dielectric layer 15. Thus, the upper portion of the alternative channel material 14 is expected to be substantially defect-free. Unfortunately, with some desirable alternative channel materials, such as III-V materials, it is very difficult to fill very high aspect ratio trenches 16 or trenches that are very narrow.

The present disclosure is directed to various methods of forming substrates comprised of different semiconductor materials that may be used to manufacture various types of semiconductor devices and integrated circuits that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming substrates comprised of different semiconductor materials that may be used to manufacture various types of semiconductor devices and integrated circuits. One illustrative method disclosed herein includes obtaining a structure comprised of a first layer of a first semiconductor material, a second layer of a second semiconductor material positioned above the first layer and a strain relief buffer layer positioned between the first and second layers, forming an opening in the second layer, forming an insulating sidewall spacer on the sidewalls of the opening and, after forming the spacer, forming a third semiconductor material in the opening on the spacer, wherein the first, second and third semiconductor materials are different semiconductor materials.

One illustrative device disclosed herein includes a first layer of a first semiconductor material, a strain relief buffer layer positioned above the first layer, a second layer of a second semiconductor material positioned above a first portion of the strain relief buffer layer, a region comprised of a third semiconductor material positioned in an opening in the second layer and above a second portion of the strain relief buffer layer, wherein the first, second and third semiconductor materials are different semiconductor materials, and an insulating material positioned between the region comprised of the third semiconductor material and the second layer of the second semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
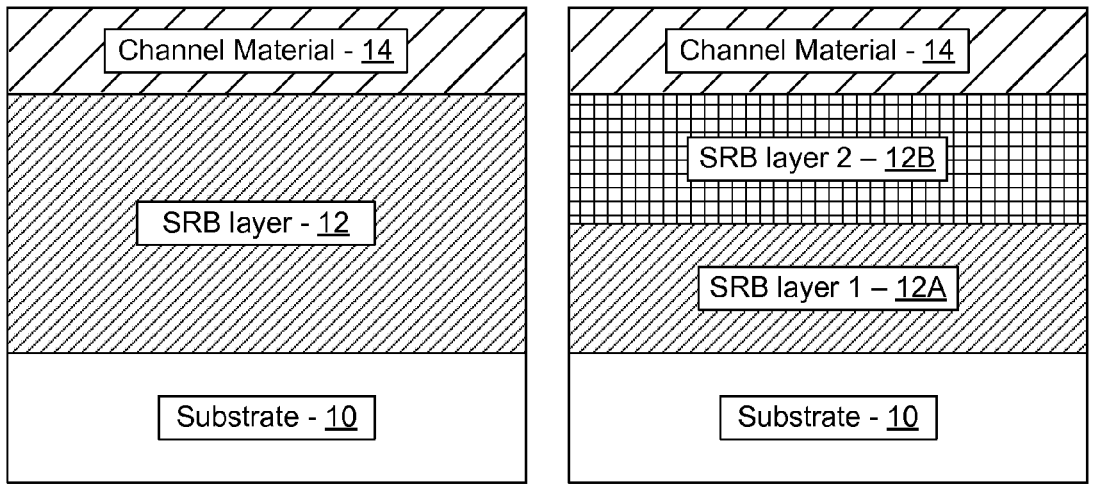
FIGS. 1A-1C depict prior art examples of forming alternative channel semiconductor materials in or above silicon substrates.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming substrates comprised of different semiconductor materials that may be used to manufacture various types of semiconductor devices and integrated circuits. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 2A:
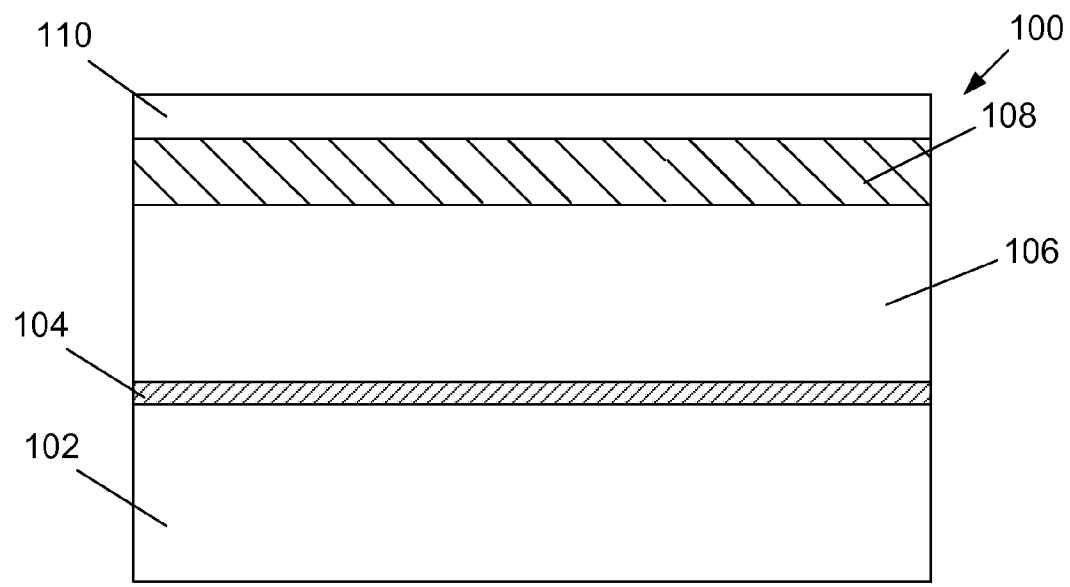
FIGS. 2A-2J depict various novel methods disclosed herein for forming substrates comprised of different semiconductor materials and the resulting substrates as well as various types of semiconductor devices and integrated circuits formed on such substrates.

FIGS. 2A-2J depict various novel methods disclosed herein for forming substrates 100 comprised of different semiconductor materials and the resulting substrates 100. As shown in FIG. 2A, the substrate 100 is comprised of a first semiconductor material layer 102, e.g., a semiconductor substrate, an insulating material layer 104, and an illustrative and representative strain relief buffer (SRB) layer 106, a second channel semiconductor material layer 108 and a layer of insulating material 110. Of course, the number of SRB layers employed, the thicknesses of such layers and the materials of construction of such layers may vary depending upon the application. Typically, the collection of SRB layers is relatively thick to facilitate the gradual transitioning from one lattice constant to another lattice constant with the goal being to achieve a substantially defect-free epi crystal as the uppermost SRB layer. The crucial role of SRB layers is to confine defects within the bottom layers so that the upper layers become low defective or preferably defect-free.

Depending upon the material of construction and the particular application, the layers of material depicted in FIG. 2A may be formed by performing a variety of known processing techniques, such as a chemical vapor deposition (CVD, MOCVD) process, an atomic layer deposition (ALD) process, an epitaxial deposition process (EPI), or plasma enhanced versions of such processes. In general, at the point of fabrication depicted in FIG. 2A, a layer of alternative channel material, the second channel semiconductor material layer 108, has been formed above a substrate, i.e., the layer 102 using one or more of the SRB-related techniques described in the background section of this application, e.g., by direct deposition or by wafer bonding techniques. Irrespective of the technique employed, the channel semiconductor material layer 108 is positioned above the surface of the layer 102. In one illustrative example, the second channel semiconductor material layer 108 may have a thickness of about 50 nm or less.

The layers of material depicted in FIG. 2A may be comprised of a variety of different materials and they may have a variety of different thicknesses depending upon the particular application. For example, the first semiconductor material layer 102 may be comprised of a semiconductor material, such as, for example, silicon, silicon germanium, germanium, etc. In one illustrative embodiment, the first semiconductor material layer 102 may take the form of a traditional silicon substrate or wafer that is commonly employed in manufacturing integrated circuit devices. In other embodiments, the first semiconductor material layer 102 may be a layer of semiconductor material that is formed, e.g., by performing an epitaxial growth process, on another structure (not shown). FIG. 2A depicts one illustrative SRB layer 106. However, as will be recognized by those skilled in the art after a complete reading of the present application, the inventions disclosed herein may employ one or many such SRB layers. For example, at one extreme, as many as 100 thin SRB layers may be formed wherein there is a step-wise change in composition in each such layer, i.e., where there is a step-wise change in the "x" component stoichiometry of the III-V ternary compound layer. For example, in a layer comprised of the compound $In_xGa_{1-x}As$, "x" may have a value that varies from 0-1, wherein "x" is fixed for a certain thickness of the layer in case of step-wise buffer. Thus, for compound layers having different thicknesses, the value of "x" may vary in value by, for example, 0.1. Thus, the stack of SRB layers may be manufactured having different thicknesses so as to achieve the desired transition between lattice constants for the overall stack of SRB layers. Alternatively, a single and relatively thick SRB layer with gradual compositional change throughout the thickness of the single layer may be employed to gradually transition from the lattice constant at the bottom of the single SRB layer to a more desirable lattice constant at the top of the single SRB layer. For gradual SRBs, the "x" may vary gradually within a layer. However, obtaining optimum epi material when changing composition conditions within a single epi deposition process is more difficult to achieve. In some applications, the overall thickness of the SRB layer(s) might be a few micrometers.

The insulating material layer 104 may be comprised of a variety of different materials and they may have a variety of different thicknesses depending upon the particular application. For example, the layer 104 may be comprised of an oxide material, such as silicon oxide or aluminum oxide, or it may be formed of other materials, such as nitrides, carbon or polymers. The SRB layer 106 may be comprised of, for example, a III-V material, indium phosphide (InP), InGaAs, GaSb, etc. In general, the SRB layer 106 may be comprised of a material with conduction and valence band offsets to the second channel semiconductor material layer 108. As described more fully below, in one illustrative embodiment disclosed herein, the SRB layer 106 can also act as an etch stop layer when an etching process is performed on the second semiconductor material layer 108.

With continuing reference to FIG. 2A, as described more fully below, portions of the second channel semiconductor material layer 108 will serve as channel semiconductor material for an illustrative transistor device to be formed on the substrate 100. The second channel semiconductor material layer 108 may be comprised of a variety of different semiconductor materials. According to one aspect of the present invention, the semiconductor material selected for the second channel semiconductor material layer 108 may be selected based upon the ability of the selected semiconductor material to enhance the performance of either N-type transistor devices or P-type transistor devices by using a material with enhanced charge carrier capabilities for each specific type device. That is, for an NMOS application, the channel semiconductor material layer 108 may be a semiconductor material that exhibits high electron mobility, i.e., an N-type high electron mobility semiconductor material. For PMOS applications, the channel semiconductor material layer 108 may be a semiconductor material that exhibits high hole mobility, i.e., a P-type high hole mobility semiconductor material. As will be recognized by those skilled in the art after a complete reading of the present application, using the methods disclosed herein, the material of the second semiconductor material layer 108 may be one that is beneficial to the formation of either N-type devices or P-type devices. For example, in the illustrative case where the layer 108 is selected based upon the intent to form N-type transistor devices in and above the second channel semiconductor material layer 108, the channel semiconductor material layer 108 may be comprised of a III-V material, indium gallium arsenide ($In_xGa_{1-x}As$), $In_xGa_{1-x}Sb$, InAs, where 'x' varies between 0 and 1, etc. In the illustrative example where the channel semiconductor material layer 108 is selected based upon the intent to form P-type transistor devices in and above the channel semiconductor material layer 108, the channel semiconductor material layer 108 may be comprised of a III-V binary or ternary compound or a group IV element, germanium, SiGe, GaSb, InGaSb, etc. In some embodiments, the second channel semiconductor material layer 108 may be formed by performing an epitaxial growth process. The layer of insulating material 110 may be comprised of a variety of different materials, such as, for example, silicon dioxide, silicon nitride, silicon oxynitride, etc., or multiple layers thereof, etc., and it may be formed by performing a variety of techniques, e.g., CVD, etc.

Figure 2B:
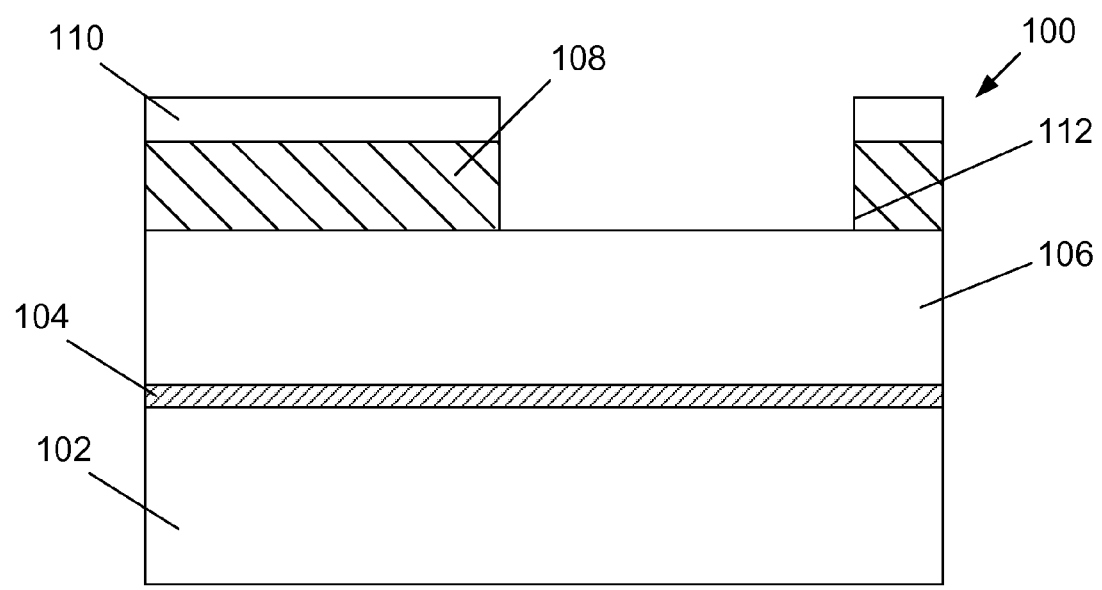

Next, as shown in FIG. 2B, one or more dry or wet etching processes is performed on the second channel semiconductor material layer 108 through a patterned mask layer (not shown) to form an opening 112 in the second channel semiconductor material layer 108. In the depicted example, the etching process stops on the SRB layer 106. However, in some embodiments, the opening 112 may not extend through the entire thickness of the second channel semiconductor material layer 108, i.e., the etching process may be stopped prior to exposing the layer 106. In another embodiment, the opening 112 may also extend through SRB layer 106 and stop on the insulating layer 104. In yet another embodiment, layers 104 and 106 may both be etched, with the etch stopping on layer 102. The overall size, shape, depth and configuration of the opening 112 may vary depending on the particular application, e.g., the depth and width of the opening 112 may vary depending upon the particular application. In the examples disclosed herein, the opening 112 is depicted as having been formed by performing an anisotropic etching process that results in the opening 112 having a schematically depicted, generally rectangular configuration with substantially vertical sidewalls. In an actual real-world device, the sidewalls of the opening 112 may be somewhat inwardly tapered, although that configuration is not depicted in the drawings. In some cases, the opening 112 may have a reentrant (retrograded) profile near the bottom of the opening 112. To the extent the opening 112 is formed by performing a wet etching process, the opening 112 may tend to have a more rounded configuration or non-linear configuration as compared to the generally rectangular configuration of the opening 112 that is formed by performing an anisotropic etching process. Thus, the size and configuration of the opening 112, and the manner in which it is made, should not be considered a limitation of the present invention. For ease of disclosure, only the substantially rectangular opening 112 will be depicted in subsequent drawings.

Figure 2C:
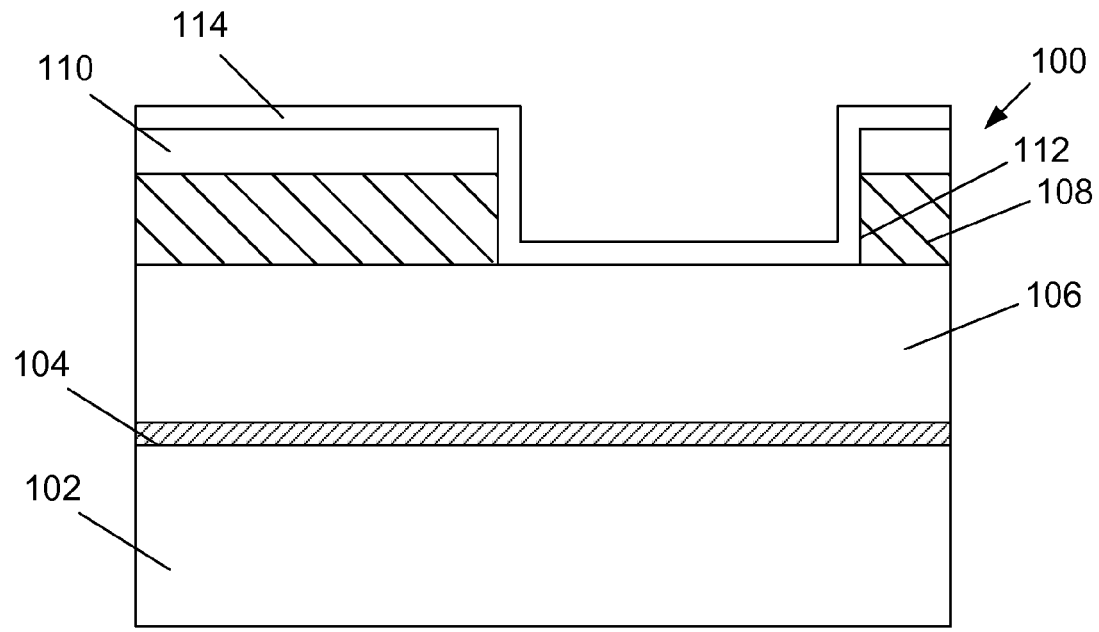

Then, as shown in FIG. 2C, a conformal deposition process, e.g., a conformal CVD or ALD process, may be performed to form a second layer of insulating material 114 above the substrate 100 and in the opening 112. The second layer of insulating material 114 may be comprised of a variety of different materials and its thickness may vary depending upon the particular application. For example, second layer of insulating material 114 may be made of any of the materials described above for the layer of insulating material 110.

Figure 2D:
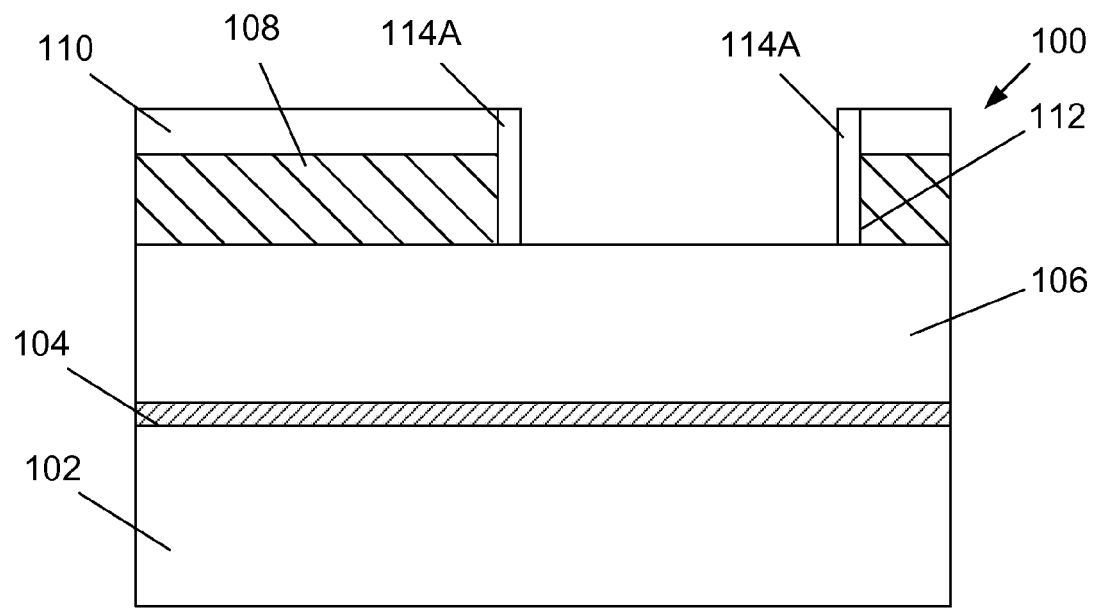

Next, as shown in FIG. 2D, an anisotropic etching process is performed on the second layer of insulating material 114 to thereby define a sidewall spacer 114A on the sidewalls of the opening 112. This etching process clears the second layer of insulating material 114 from the bottom of the opening 112. The thickness or width of the spacer 114A may vary depending on the particular application, e.g., it may have a thickness that falls within the range of about 3-30 nm. In some embodiments, the thickness of the sidewall spacer 114A is selected such that it is thick enough to provide the required electrical isolation between a semiconductor device that will be formed in a semiconductor material to be formed in the opening 112 (as described more fully below) and any adjacent semiconductor devices form in the layer 108

Figure 2E:
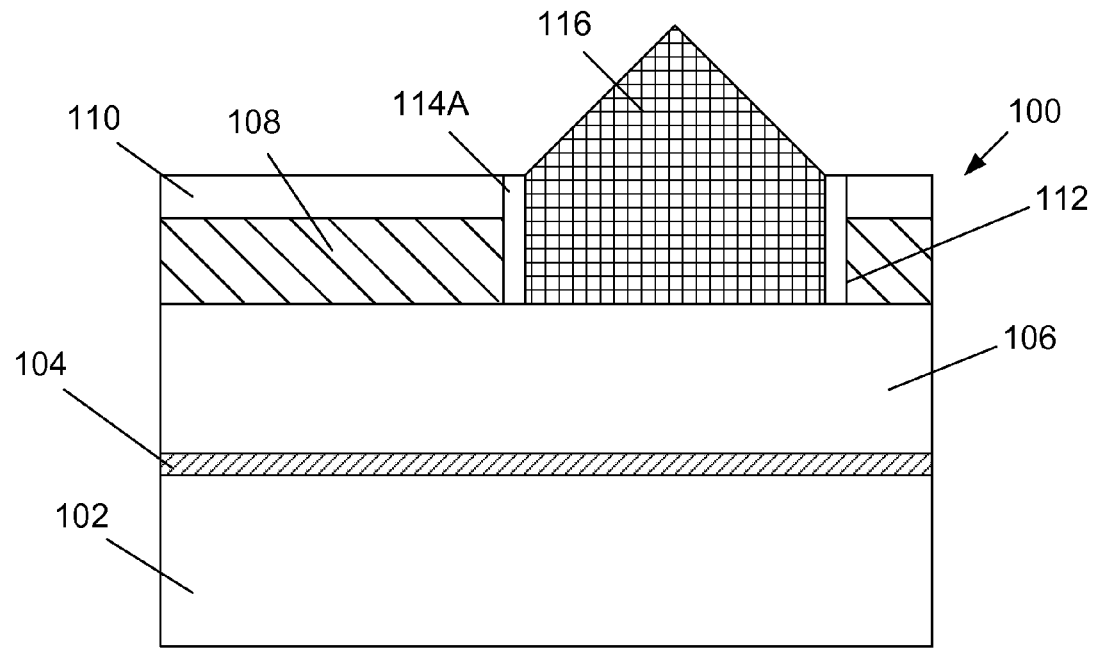

FIG. 2E depicts the substrate 100 after a region or layer of a third semiconductor material 116 has been epitaxially grown in the opening 112, in the region where the dielectric material 114 has been removed. In general, according to one aspect of the presently disclosed inventions, the semiconductor material selected for the third semiconductor material 116 may be selected based upon the ability of the selected semiconductor material to enhance the performance of either N-type transistor devices or P-type transistor devices, i.e., N-type high electron mobility semiconductor material or a P-type high hole mobility semiconductor material, respectively, that are to be formed in and above the third semiconductor material 116. As mentioned above, if the material of the second channel semiconductor material layer 108 was selected based upon forming N-type devices in and above the second channel semiconductor material layer 108, then the material of the third semiconductor material 116 may be selected based upon forming P-type devices in and above the third semiconductor material 116. The third semiconductor material 116 may be comprised of any of the materials identified above for the second channel semiconductor material layer 108. In one particularly illustrative example, the second channel semiconductor material layer 108 may be comprised of indium gallium arsenide (InGaAs), for the formation of N-type devices, the third semiconductor material 116 may be comprised of germanium (Ge), for the formation of P-type devices, and the first semiconductor material layer 102 may be comprised of silicon, i.e., all three semiconductor materials are different from one another. The shape of the upper portion of the third semiconductor material 116, as depicted in FIG. 2E, may vary, as the shape is dependent upon the crystalline structure and orientation of the underlying layers 106 and 102 and the nature of the process in growing the third semiconductor material 116 in the opening 112. In general, the lattice constants of materials 106, 108 and 116 may be different, such that the growth and strain of the respective layers can be managed. For example, in the detailed example above, the silicon layer 102 may have a lattice constant of about 5.4307 Å, an $In_xGa_{1-x}As$ layer 108 may have a lattice constant of about 5.65-6.06 Å—depending on 'x' parameter—and a germanium region 116 may have a lattice constant of about 5.6576. In that specific example, the SRB layer 106 may be a layer of indium aluminum arsenide ($In_xAl_{1-x}As$) or indium phosphide (InP) having a lattice constant of about 5.87 Å.

Figure 2F:
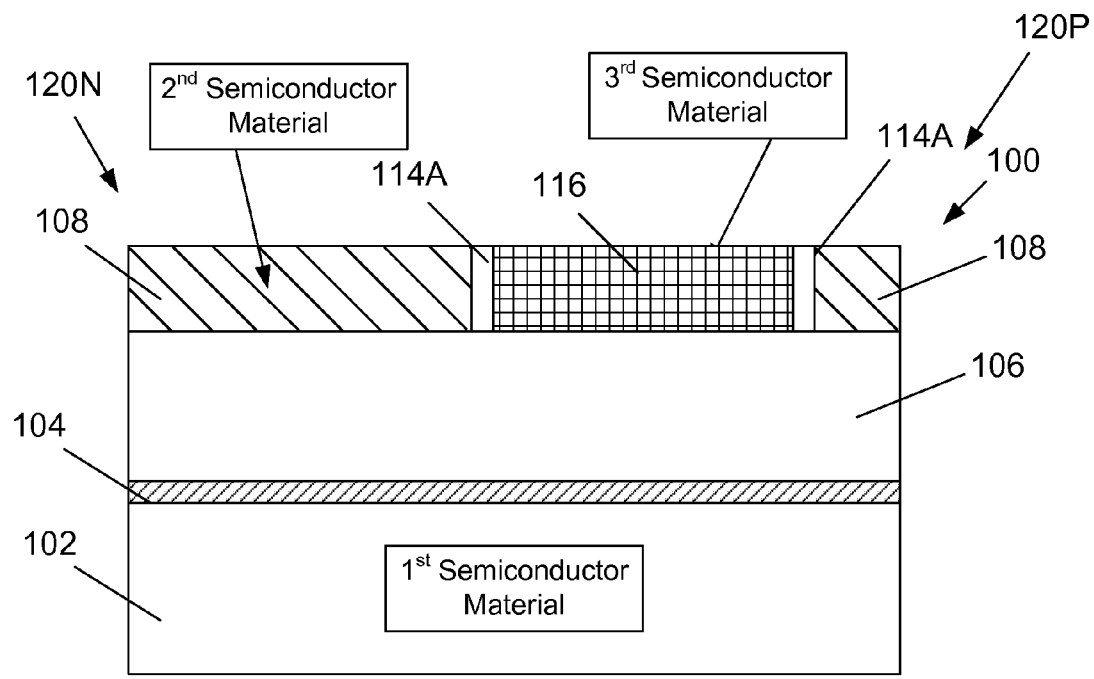

FIG. 2F depicts the substrate 100 after one or more chemical mechanical polishing (CMP) processes was performed to planarize the upper surface of the substrate 100 using the second semiconductor material layer 108 as a polish stop layer. Alternatively, this may be a timed non-selective etching process. This process operation clears the upper surface of the channel semiconductor material layer 108 of any remnants of the layer of insulating material 110 and provides a substantially planar upper surface on the substrate 100 to facilitate subsequent processing operations. Alternatively, layer 110 may be removed by an etching step prior to performing a CMP process to planarize the surface. In the depicted example, the finished substrate 100 comprises first, second and third semiconductor materials, wherein the third semiconductor material 116 is isolated from the second semiconductor material 108 by the spacer 114A. Additionally, in the depicted example, the second and third semiconductor materials 108, 116 are separated from the first semiconductor material 102 by illustrative layers 104, 106. Thus, the substrate 100 defines an N-region 120N where N-type transistor devices may be formed and a P-region 120P where P-type transistor devices may be formed. Of course, depending upon the physical size of the regions 120N, 120P, they may be further divided into smaller active regions by the formation of well-known trench isolation structures (not shown) as needed for the particular integrated circuit product being fabricated.

Figure 2G:
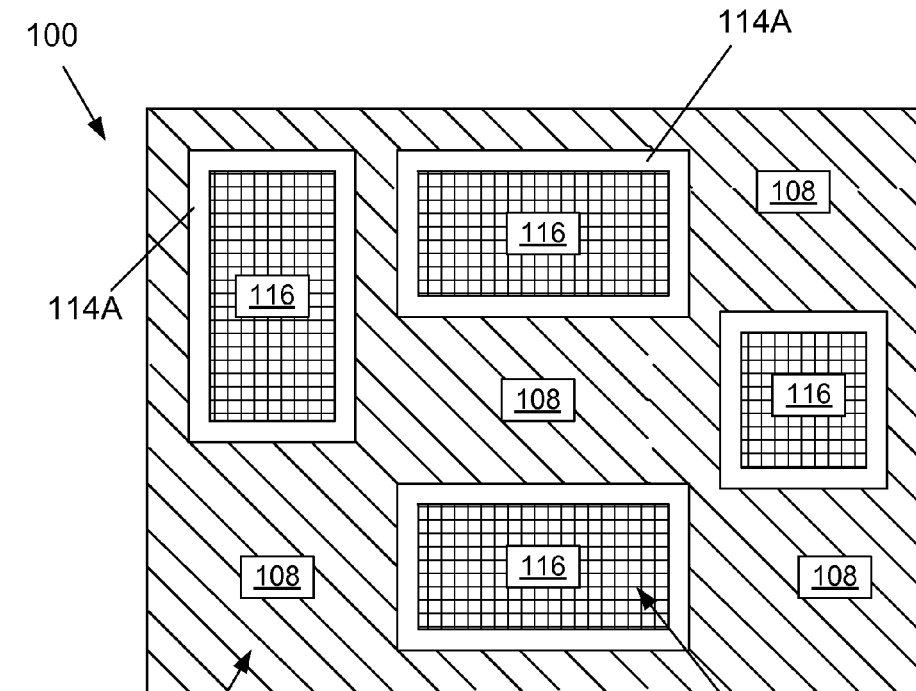
Figure 2H:
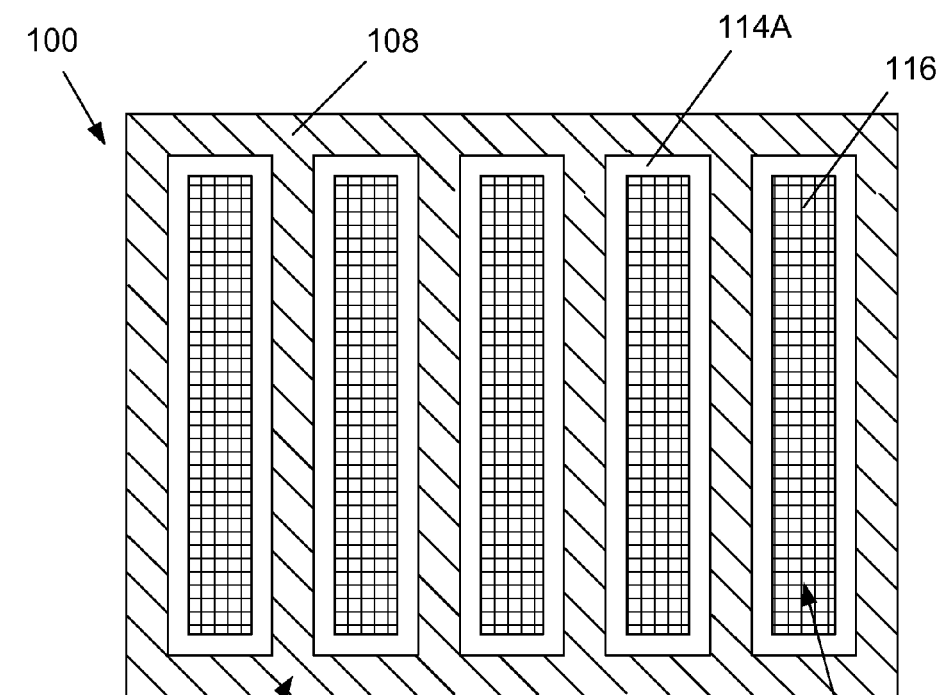

FIGS. 2G-2H are plan views of the upper surface of the substrate 100 after the above described CMP process operation has been performed wherein the cross-sectional shading of the various regions has been maintained for explanation purposes. As depicted, using the methods disclosed herein, the substrate 100 is comprised of a plurality of isolated regions of the third semiconductor material 116 formed in the second channel semiconductor material layer 108. The regions of the third semiconductor material 116 are separated from the regions of the second channel semiconductor material 108 by the sidewall spacer 114A. Of course, as noted above, the regions 108 and 116 may be further divided by forming trench isolation regions if desired or needed for the particular application. FIG. 2H depicts a particular embodiment wherein the isolated regions of the third semiconductor material 116 are relatively densely packed.

Figure 2I:
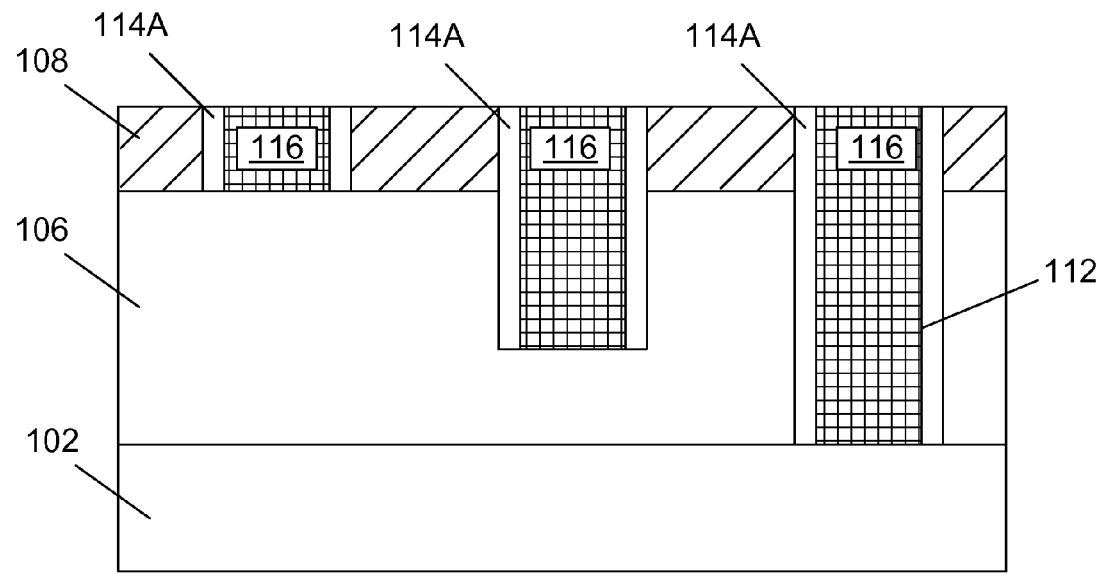
Figure 2J:
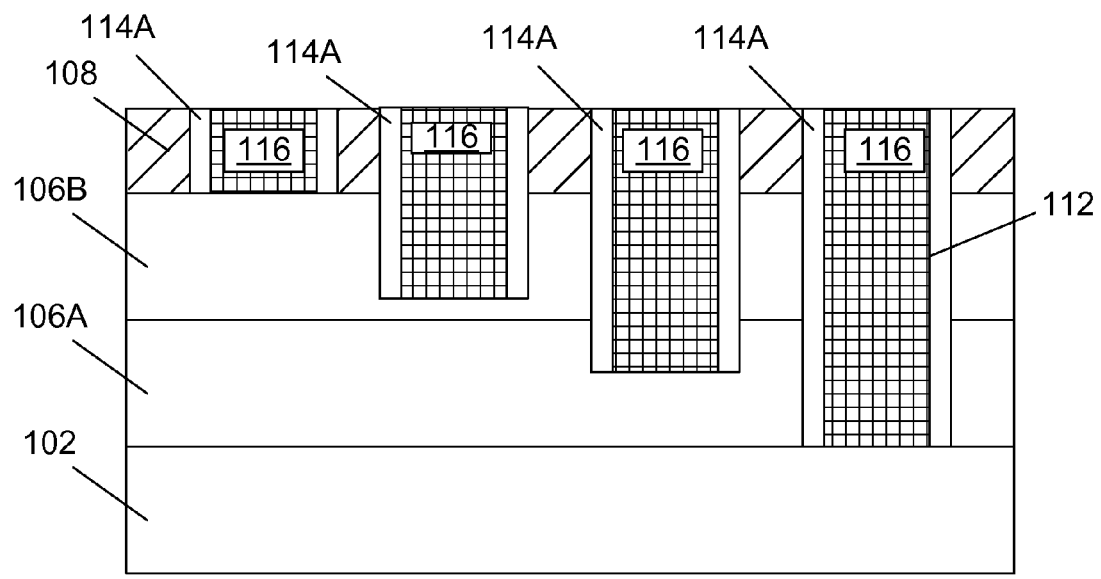

As mentioned above, the depth of the trenches 112 and the resulting isolated regions of the third semiconductor material 116 may vary depending upon the particular application. FIGS. 2I-2J show various examples of the depth of the trenches 112 and resulting isolated regions of the third semiconductor material 116. FIG. 2I depicts the illustrative example where a single SRB layer 106 is formed above the substrate 102. The right-most isolated region of the third semiconductor material 116 shown in FIG. 2I extends all the way down to the substrate 102, i.e., when the trench 112 was formed, the etching process stopped on the substrate 102. The left-most isolated region of the third semiconductor material 116 shown in FIG. 2I extends down to the upper surface of the SRB layer 106, i.e., when the trench 112 was formed, the etching process stopped on the SRB layer 106—a situation that corresponds to the process flow depicted in FIGS. 2A-2F. The middle isolated region of the third semiconductor material 116 shown in FIG. 2I extends down into the SRB layer 106 but stops short of the substrate 102, i.e., when the trench 112 was formed, the etching process was a timed etching process that was stopped at some point when the trench 112 had penetrated the SRB layer 106 but before the substrate 102 was exposed.

FIG. 2J depicts the illustrative situation where the device includes a plurality of illustrative SRB layers 106A/B that are formed above the substrate 102. In this example, the right-most isolated region of the third semiconductor material 116 shown in FIG. 2J extends all the way down to the substrate 102, i.e., when the trench 112 was formed, the etching process proceeded through the SRB layer 106A/B and stopped on the substrate 102. The isolated region of the third semiconductor material 116 shown in the right center of FIG. 2J extends down into the lower SRB layer 106A but stops short of the substrate 102, i.e., when the trench 112 was formed, the etching process was a timed etching process that was stopped at some point when the trench 112 had penetrated through the upper SRB layer 106B and into the SRB layer 106A but before the substrate 102 was exposed. The isolated region of the third semiconductor material 116 shown in left center of FIG. 2J extends down into the upper SRB layer 106B but stops short of the lower SRB layer 106A, i.e., when the trench 112 was formed, the etching process was a timed etching process that was stopped at some point when the trench 112 had penetrated the SRB layer 106B but before the SRB layer 106B was exposed. The left-most isolated region of the third semiconductor material 116 shown in FIG. 2J extends down to the upper surface of the uppermost SRB layer 106B, i.e., when the trench 112 was formed, the etching process stopped on the SRB layer 106B.

Figure 1B:
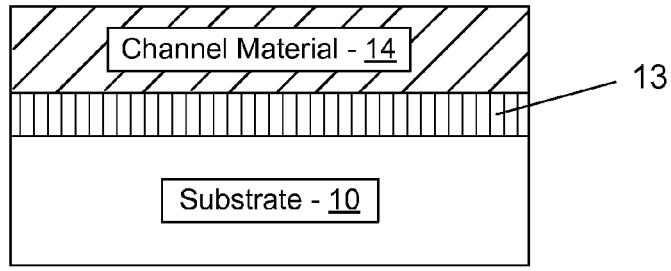
Figure 1C:
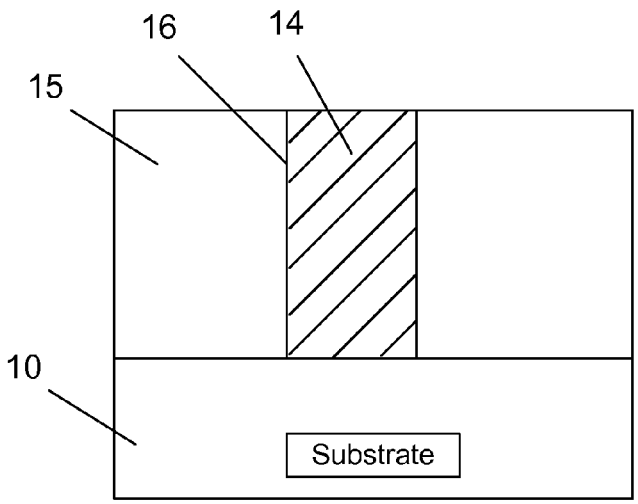

Likewise, this can be done on the structures shown in FIG. 1B, where the etch may terminate part-way through the channel layer 14, or on the surface of the substrate 10, or in a timed etch where the etch terminates partially in the substrate 10.

Figure 3A:
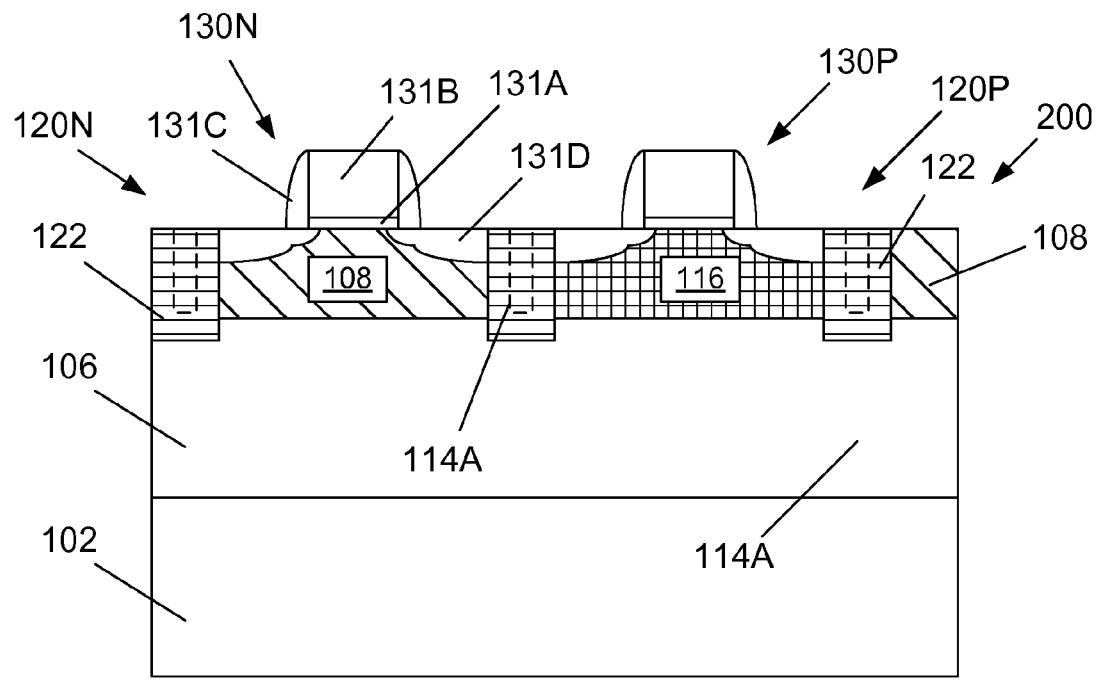
FIGS. 3A-3B depict illustrative examples of novel integrated circuit products that may be formed on the novel substrates disclosed herein.
Figure 3B:
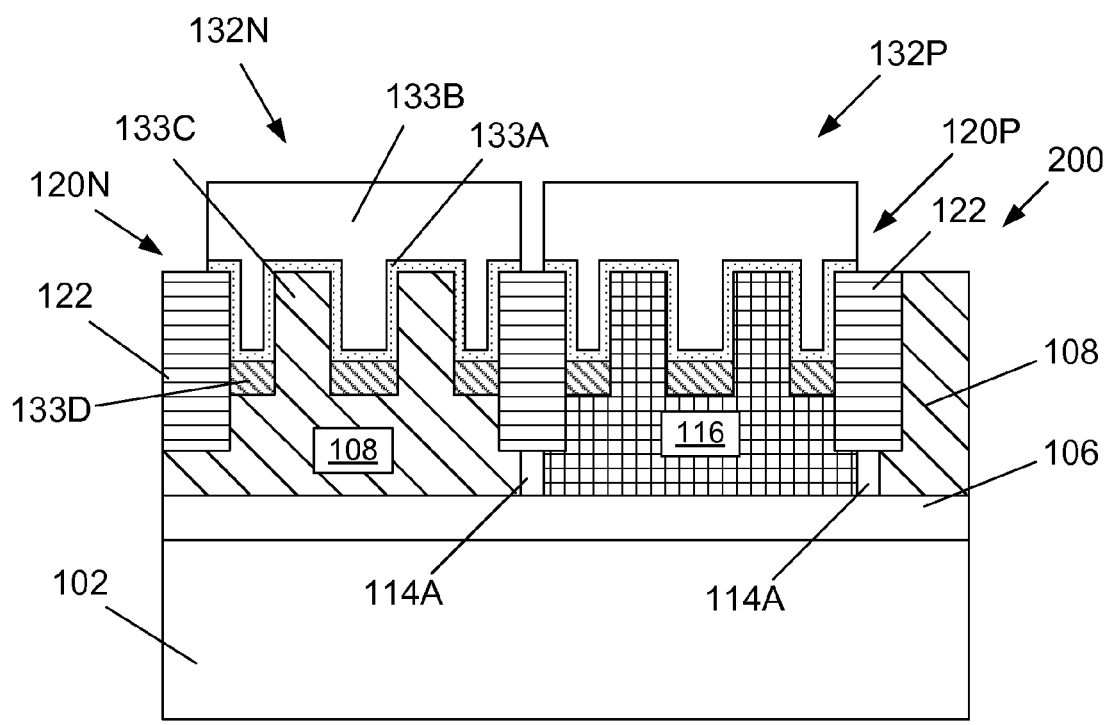

FIGS. 3A-3B depict illustrative examples of integrated circuit products 200 that may be formed on the illustrative substrates 100 disclosed herein. As depicted in FIG. 3A, illustrative shallow trench isolation regions 122 have been formed in and above the substrate 100. The outline of the spacers 114A is shown in dashed lines in FIG. 3A. In some embodiments, the spacers 114A alone may provide sufficient electrical isolation between adjacent devices. Also depicted in FIG. 3A are a plurality of illustrative planar transistors. More specifically, an illustrative NFET device 130N has been formed in and above a portion of the second semiconductor material layer 108, while an illustrative PFET device 130P has been formed in and above a portion of the third semiconductor material 116. The devices 130N, 130P are intended to be representative in nature as the structure and composition of such devices are well known to those skilled in the art. In general, each of the transistor devices 130N, 130P is comprised of a gate insulation layer 131A, a gate electrode 131B, a sidewall spacer 131C and source/drain regions 131D, although the materials of construction for the devices 130N, 130P may be different from one another depending upon the particular application.

In the example depicted in FIG. 3B, a plurality of illustrative FinFET devices have been formed in and above the substrate 100 using traditional techniques. More specifically, an illustrative N-FinFET device 132N has been formed in and above a portion of the second semiconductor material layer 108, while an illustrative P-FinFET device 132P has been formed in and above a portion of the third semiconductor material 116. The devices 132N, 132P are intended to be representative in nature as the structure and composition of such devices are well known to those skilled in the art. In general, each of the FinFET devices 132N, 132P is comprised of a gate insulation layer 133A, a gate electrode 133B, a plurality of fins 133C and a layer of insulating material 133D, although the materials of construction for the devices 132N, 132P may be different from one another depending upon the particular application. Of course, if desired, both planar and 3D devices may be formed above the same substrate 100. Additionally, semiconductor devices other than the illustrative transistor devices depicted in FIGS. 3A-3B may also be formed above the substrate 100, e.g., resistors, capacitors, etc.

The gate structures of the devices 130N, 130P, 132N, 132P, i.e., the gate insulation layer and the gate electrode, are intended to be representative in nature. That is, the gate structures may be comprised of a variety of different materials and they may have a variety of configurations. For example, the gate insulation layers may be comprised of a variety of different materials, such as, for example, silicon dioxide, a so-called high-k (k greater than 7) insulation material (where k is the relative dielectric constant), etc. Similarly, the gate electrodes may also be of a variety of conductive materials such as polysilicon or amorphous silicon, or it may be comprised of one or more metal layers that act as the gate electrode.

As will be appreciated by those skilled in the art after a complete reading of the present application, the inventions disclosed herein provide device designers with a new and effective way to form transistor devices with alternative channel materials in a way that is believed to be more efficient and compatible with traditional CMOS manufacturing activities and CMOS-based product designs. Thus, the methods and devices disclosed herein will enable device designers to meet the ongoing challenges of improving the performance of integrated circuit products.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   obtaining a structure comprised of a first layer of a first semiconductor material, a layer of insulating material positioned on and in contact with an upper surface of said first layer, at least one strain relief buffer layer positioned above an upper surface of said layer of insulating material, a second layer of a second semiconductor material positioned on and in contact with said at least one strain relief buffer layer, wherein an upper surface of said at least one strain relief buffer layer contacts a lower surface of said second layer;
   forming a patterned masking layer above said second layer;
   performing at least one etching process to form an opening in said second layer to thereby expose a portion of said strain relief buffer layer at a bottom of said opening, said opening having sidewalls;
   forming an insulating sidewall spacer on said sidewalls of said opening;
   after forming said sidewall spacer, forming a third semiconductor material in said opening on said exposed portion of said strain relief buffer layer so as to overfill said opening with said third semiconductor material, wherein said first, second and third semiconductor materials are different semiconductor materials;
   after forming said third semiconductor material, performing at least one chemical mechanical planarization process to remove said patterned masking layer and thereby produce a substantially planar surface that includes planarized and substantially coplanar upper surfaces of said second layer, said third semiconductor material and said sidewall spacer;
   forming a first transistor device in and above said second layer, wherein forming said first transistor device comprises forming a gate insulation layer for said first transistor device on and in contact with said planarized upper surface of said second layer; and
   forming a second transistor device in and above said third semiconductor material, wherein said second transistor device is a type that is opposite said first transistor device and wherein forming said second transistor device comprises forming a gate insulation layer for said second transistor device on and in contact with said planarized upper surface of said third semiconductor material.

2. The method of claim 1, wherein said first semiconductor material is comprised of silicon, germanium or silicon germanium, said second semiconductor material is comprised of a III-V binary or ternary compound or a group IV element and said third semiconductor material is comprised of a III-V binary or ternary compound or a group IV element.

3. The method of claim 1, wherein said second semiconductor material is an N-type high electron mobility semiconductor material and said third semiconductor material is a P-type high hole mobility semiconductor material.

4. The method of claim 3, wherein said first transistor device is one of an N-type FET device or an N-type FinFET device and said second transistor device is one of a P-type FET device or a P-type FinFET device.

5. The method of claim 1, wherein said second semiconductor material is a P-type high hole mobility semiconductor material and said third semiconductor material is an N-type high electron mobility semiconductor material.

6. The method of claim 5, wherein said first transistor device is one of a P-type FET device or a P-type FinFET device and said second transistor device is one of an N-type FET device or an N-type FinFET device.

7. The method of claim 1, wherein said at least one strain relief buffer layer comprises multiple layers and wherein a top layer of said strain relief buffer layer is substantially defect free.

8. The method of claim 1, wherein said at least one strain relief buffer layer is comprised of one of silicon, germanium, a III-V material, indium gallium arsenide (InGaAs), InGaSb, or InAs.

9. The method of claim 1, wherein said at least one strain relief buffer layer is deposited on said layer of insulating material.

10. The method of claim 1, wherein said layer of insulating material is comprised of one of silicon dioxide, aluminum oxide, a nitride, carbon or a polymer.

11. A method, comprising:
    depositing a layer of insulating material on and in contact with an upper surface of a first layer of a first semiconductor material;
    performing at least one deposition process to deposit at least one strain relief buffer layer positioned above an upper surface of said layer of insulating material;
    performing an epitaxial deposition process to deposit a second layer of a second semiconductor material on and in contact with an uppermost surface of said at least one strain relief buffer layer;
    forming a patterned masking layer above said second layer;

performing at least one etching process to form an opening in said second layer to thereby expose a portion of said uppermost surface of said strain relief buffer layer at a bottom of said opening, said opening having sidewalls;

forming an insulating sidewall spacer on said sidewalls of said opening;

after forming said sidewall spacer, forming a third semiconductor material in said opening on said exposed portion of said uppermost surface of said strain relief buffer layer so as to overfill said opening with said third semiconductor material, wherein said first, second and third semiconductor materials are different semiconductor materials;

after forming said third semiconductor material, performing at least one chemical mechanical planarization process to remove said patterned masking layer and thereby produce a substantially planar surface that includes planarized and substantially coplanar upper surfaces of said second layer, said third semiconductor material and said sidewall spacer;

forming a first transistor device in and above said second layer, wherein forming said first transistor device comprises forming a gate insulation layer for said first transistor device on and in contact with said planarized upper surface of said second layer; and forming a second transistor device in and above said third semiconductor material, wherein said second transistor device is a type that is opposite said first transistor device and wherein forming said second transistor device comprises forming a gate insulation layer for said second transistor device on and in contact with said planarized upper surface of said third semiconductor material.

12. The method of claim 11, wherein said first semiconductor material is comprised of silicon, germanium or silicon germanium, said second semiconductor material is comprised of a III-V binary or ternary compound or a group IV element and said third semiconductor material is comprised of a III-V binary or ternary compound or a group IV element.

13. The method of claim 11, wherein said second semiconductor material is an N-type high electron mobility semiconductor material and said third semiconductor material is a P-type high hole mobility semiconductor material.

14. The method of claim 13, wherein said first transistor device is one of an N-type FET device or an N-type FinFET device and said second transistor device is one of a P-type FET device or a P-type FinFET device.

15. The method of claim 11, wherein said second semiconductor material is a P-type high hole mobility semiconductor material and said third semiconductor material is an N-type high electron mobility semiconductor material.

16. The method of claim 15, wherein said first transistor device is one of a P-type FET device or a P-type FinFET device and said second transistor device is one of an N-type FET device or an N-type FinFET device.

17. The method of claim 11, wherein said at least one strain relief buffer layer comprises multiple layers and wherein said uppermost surface of said at least one strain relief buffer layer is substantially defect free.

18. The method of claim 11, wherein said at least one strain relief buffer layer is comprised of one of silicon, germanium, a III-V material, indium gallium arsenide (InGaAs), InGaSb, or InAs.

19. The method of claim 11, wherein said layer of insulating material is comprised of one of silicon dioxide, aluminum oxide, a nitride, carbon or a polymer.

* * * * *